(12) United States Patent
Liao et al.

(10) Patent No.: US 11,532,559 B2
(45) Date of Patent: Dec. 20, 2022

(54) SEMICONDUCTOR DEVICE AND METHOD FOR MAKING THE SEMICONDUCTOR DEVICE

(71) Applicant: TAIWAN SEMICONDUCTOR MANUFACTURING COMPANY, LTD., Hsinchu (TW)

(72) Inventors: Yun-Jhen Liao, Hsinchu (TW); Huei-Shan Wu, Hsinchu (TW); Chun-Wei Liao, Hsinchu (TW); Yi-Lii Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/184,801

(22) Filed: Feb. 25, 2021

(65) Prior Publication Data

US 2022/0270980 A1   Aug. 25, 2022

(51) Int. Cl.
| | |
|---|---|
| *H01L 23/532* | (2006.01) |
| *H01L 23/528* | (2006.01) |
| *H01L 23/522* | (2006.01) |
| *H01L 21/768* | (2006.01) |

(52) U.S. Cl.
CPC .. *H01L 23/53266* (2013.01); *H01L 21/76816* (2013.01); *H01L 21/76843* (2013.01); *H01L 21/76879* (2013.01); *H01L 23/5226* (2013.01); *H01L 23/5283* (2013.01); *H01L 23/53238* (2013.01)

(58) Field of Classification Search
CPC ........... H01L 23/53266; H01L 23/5226; H01L 23/5283; H01L 23/53238; H01L 21/76816; H01L 21/76843; H01L 21/76879
See application file for complete search history.

(56) References Cited

U.S. PATENT DOCUMENTS

| | | | | |
|---|---|---|---|---|
| 2013/0049219 A1* | 2/2013 | Tsai | ................... | H01L 21/02063 257/774 |
| 2019/0148291 A1* | 5/2019 | Peng | .................. | H01L 21/76885 257/411 |
| 2021/0391212 A1* | 12/2021 | Huang | ................... | H01L 23/485 |

* cited by examiner

*Primary Examiner* — Shahed Ahmed
*Assistant Examiner* — Vicki B. Booker
(74) *Attorney, Agent, or Firm* — Birch, Stewart, Kolasch & Birch, LLP

(57) ABSTRACT

A semiconductor device includes a first dielectric layer, a cobalt-containing conductive feature, a non-cobalt conductive feature, a second dielectric layer, a first tungsten contact feature, a second tungsten contact feature, and a tungsten barrier layer. The cobalt-containing conductive feature is disposed in the first dielectric layer. The non-cobalt conductive feature is disposed in the first dielectric layer, and is spaced apart from the cobalt-containing conductive feature. The second dielectric layer is disposed over the first dielectric layer. The first tungsten contact feature is disposed in the second dielectric layer, and is electrically connected to the cobalt-containing conductive feature. The second tungsten contact feature is disposed in the second dielectric layer, and is electrically connected to the non-cobalt conductive feature. The tungsten barrier layer surrounds the second tungsten contact feature, and is connected to the second tungsten contact feature, the non-cobalt conductive feature and the second dielectric layer.

20 Claims, 18 Drawing Sheets

SEMICONDUCTOR DEVICE AND METHOD FOR MAKING THE SEMICONDUCTOR DEVICE

BACKGROUND

The semiconductor integrated circuit (IC) industry exhibits tremendous technological growth over the past decades. With the dramatic advances in IC design, the circuits of new generations of ICs are scaled down and become more complicated. In an IC device, MEOL (middle-end-of-line) contact structures are used to electrically connect FEOL (front-end-of-line) devices to BEOL (back-end-of-line) interconnect structures, and play an important role in the electrical performance of the IC device. Thus, the IC industry pays much attention on the development of the MEOL contact structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
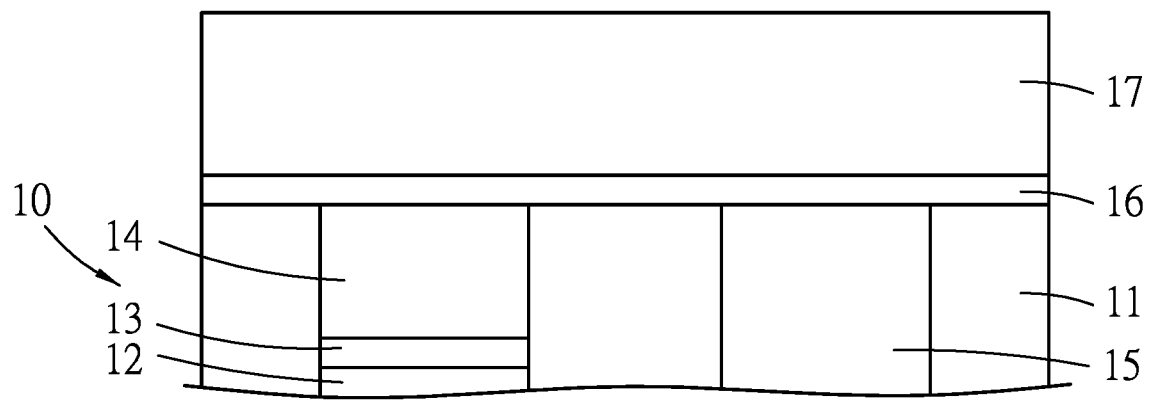
FIGS. 1 to 10 illustrate schematic views of steps in the formation of a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 10 illustrate schematic views of intermediate steps in the formation of a semiconductor device in accordance with some embodiments.

Referring to FIG. 1, a semiconductor structure 10 is provided. In some embodiments, the semiconductor structure 10 includes a substrate (not shown), a first dielectric layer 11 formed over the substrate by a suitable deposition technique (e.g., chemical vapor deposition (CVD) or the like), a source/drain 12 formed on the substrate, a silicide 13 connected to the source/drain 12, a cobalt-containing conductive feature 14 connected to the silicide 13, and a non-cobalt conductive feature 15 spaced apart from the cobalt-containing conductive feature 14. In some embodiments, the source/drain 12 may be a source or drain region of a transistor, and may be formed in the substrate or over the substrate in the first dielectric layer 11. In some embodiments, the semiconductor structure 10 further includes a first etch stop layer 16 formed on the first dielectric layer 11 by a suitable deposition technique, such as CVD or the like. In some embodiments, the semiconductor structure 10 further includes a second dielectric layer 17 formed on the first etch stop layer 16 by a suitable deposition technique, such as CVD or the like.

Figure 2:
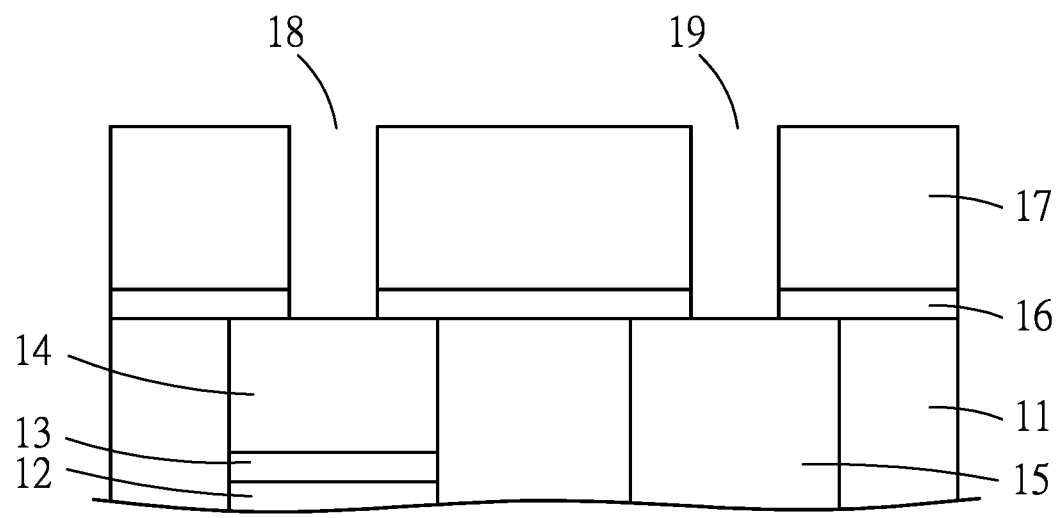

FIG. 2 illustrates that, after the formation of the second dielectric layer 17, the second dielectric layer 17 and the first etch stop layer 16 are etched to form a first opening 18 and a second opening 19, such that the cobalt-containing conductive feature 14 is exposed from the first opening 18, and the non-cobalt conductive feature 15 is exposed from the second opening 19.

Figure 3:
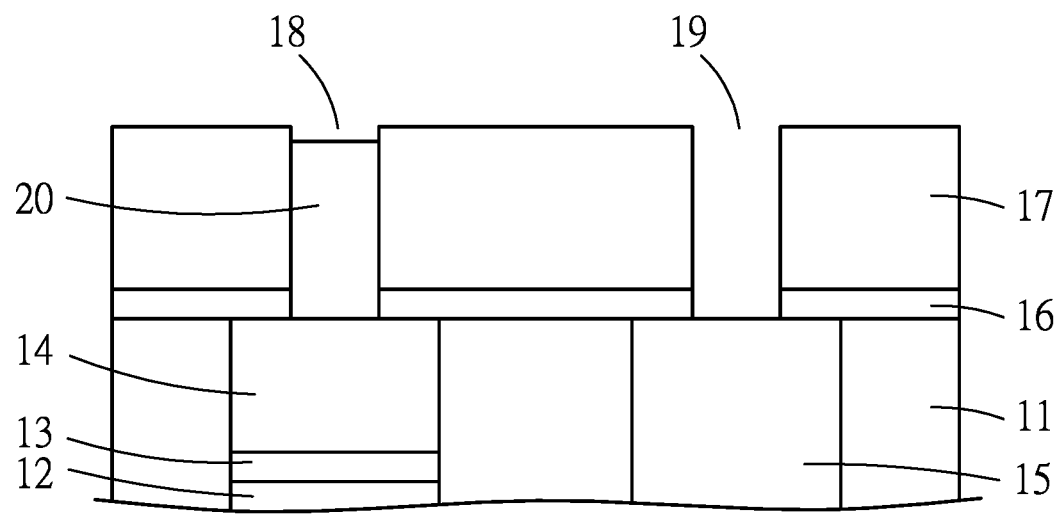

FIG. 3 illustrates that, after the formation of the first opening 18 and the second opening 19, a first tungsten contact feature 20 is selectively formed in the first opening 18. The first tungsten contact feature 20 is disposed over and electrically connected to the cobalt-containing conductive feature 14. In some embodiments, the first opening 18 may only be partially filled with the first tungsten contact feature 20.

Figure 4:
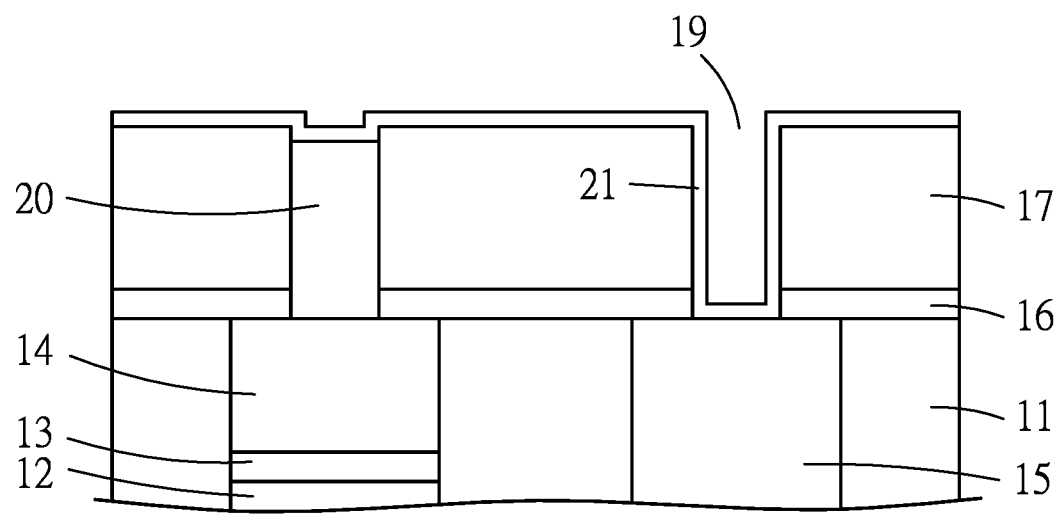

FIG. 4 illustrates that, after the formation of the first tungsten contact feature 20, a titanium barrier layer 21 is formed on a top surface of the second dielectric layer 17, a hole-defining wall of the second dielectric layer 17 defining the second opening 19, and a top surface of the non-cobalt conductive feature 15 that is exposed from the second opening 19. In this step, a portion of the titanium barrier layer 21 may be formed in the first opening 18 (see FIG. 3) and on the first tungsten contact feature 20. In other words, the first opening 18 may be completely filled with the first tungsten contact feature 20 and the titanium barrier layer 21. In some embodiments, the titanium barrier layer 21 may be formed by a suitable deposition technique, such as physical vapor deposition (PVD), CVD, atomic layer deposition (ALD) or the like, and may include multiple layers of titanium and titanium nitride.

Figure 5:
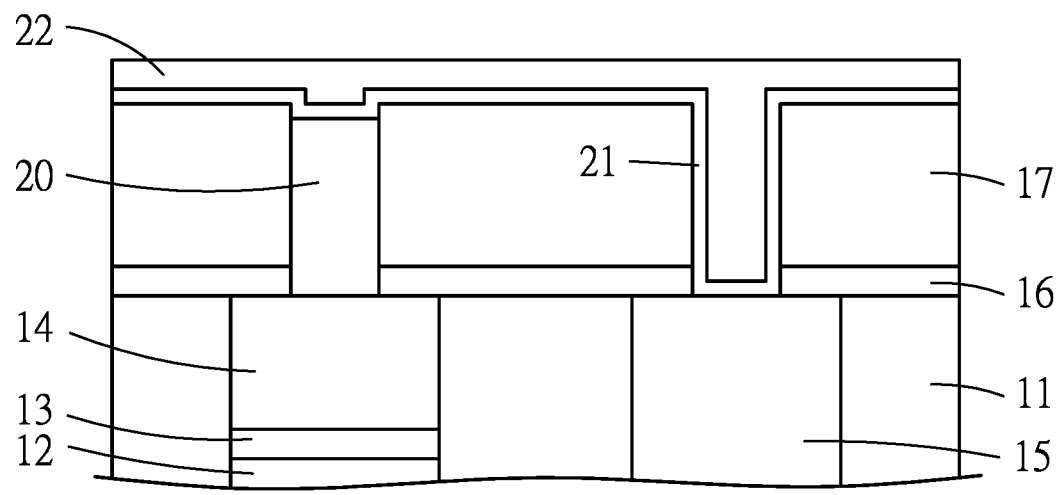

FIG. 5 illustrates that, after the formation of the titanium barrier layer 21, a tungsten layer 22 is formed on the titanium barrier layer 21 and fills the second opening 19 (see FIG. 4). In some embodiments, the tungsten layer 22 may be formed by a suitable technique, such as CVD or the like.

Figure 6:
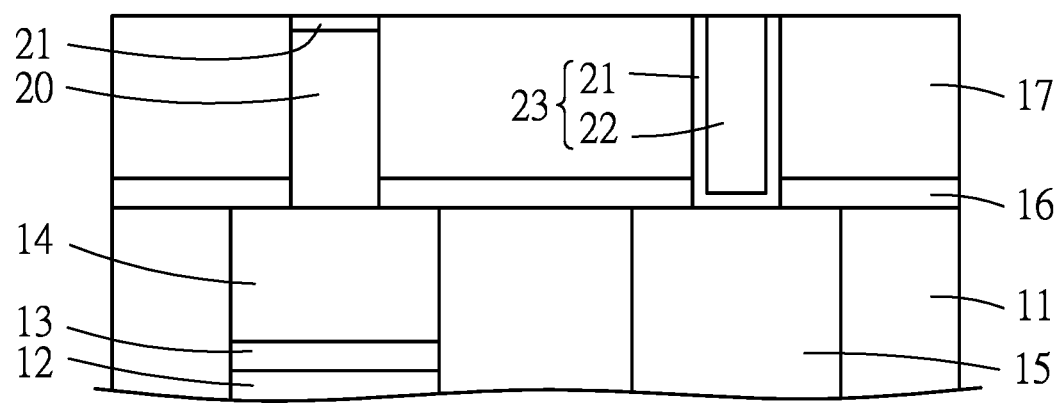

FIG. 6 illustrates that, after the formation of the tungsten layer 22, the titanium barrier layer 21 and the tungsten layer 22 on the top surface of the second dielectric layer 17 are removed to form a second tungsten contact feature 23 in the second opening 19 (see FIG. 4). The titanium barrier layer 21 and the tungsten layer 22 may be removed by a suitable technique, such as chemical mechanical planarization (CMP) or the like. In this step, the titanium barrier layer 21 surrounds the tungsten layer 22 in the second opening 19, and is connected to the tungsten layer 22, the non-cobalt conductive feature 15 and the second dielectric layer 17. The second tungsten contact feature 23 is electrically connected to the non-cobalt conductive feature 15.

Figure 7:
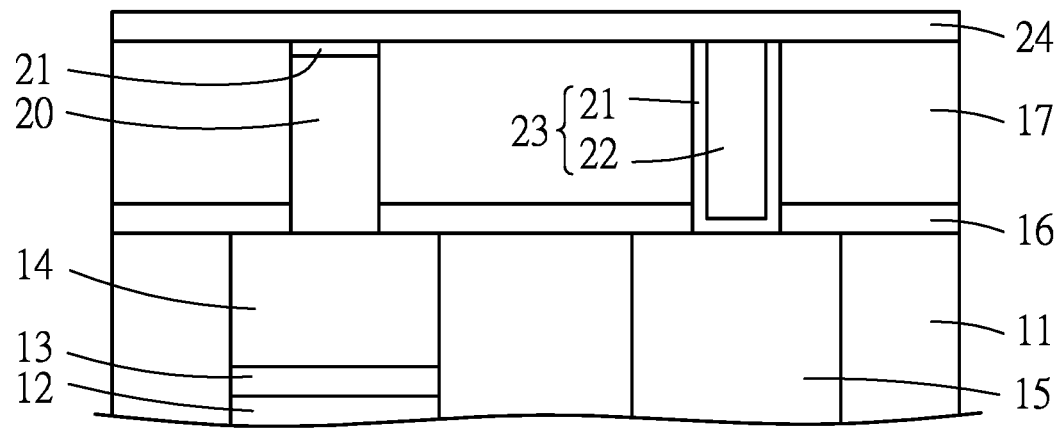

FIG. 7 illustrates that, after removal of the titanium barrier layer 21 and the tungsten layer 22, a second etch stop layer 24 is formed on the second dielectric layer 17 by a suitable deposition technique, such as CVD or the like.

Figure 8:
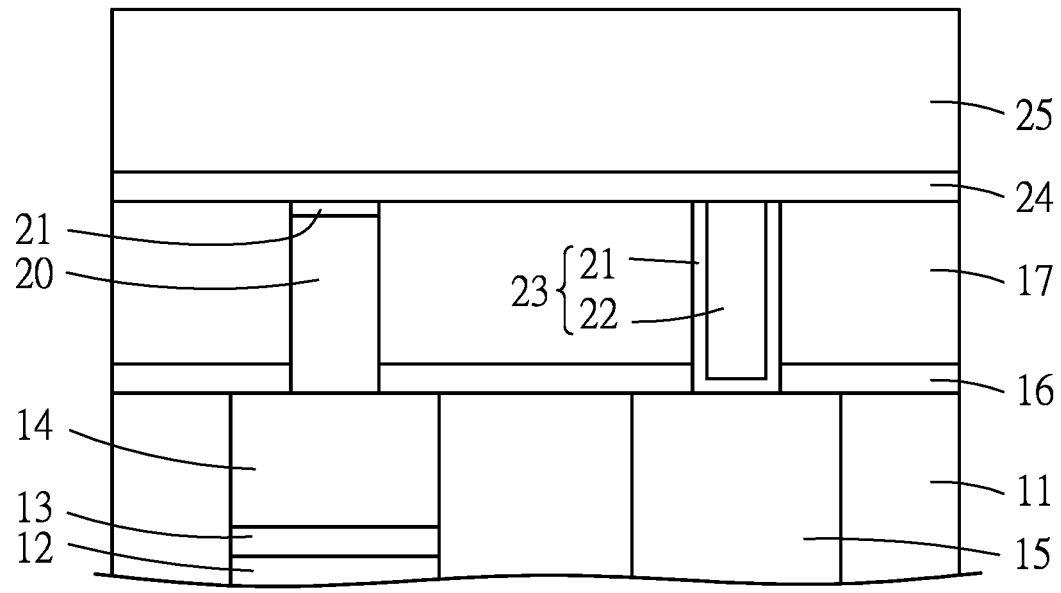

FIG. 8 illustrates that, after the formation of the second etch stop layer 24, a third dielectric layer 25 is formed on the second etch stop layer 24 by a suitable deposition technique, such as CVD or the like.

Figure 9:
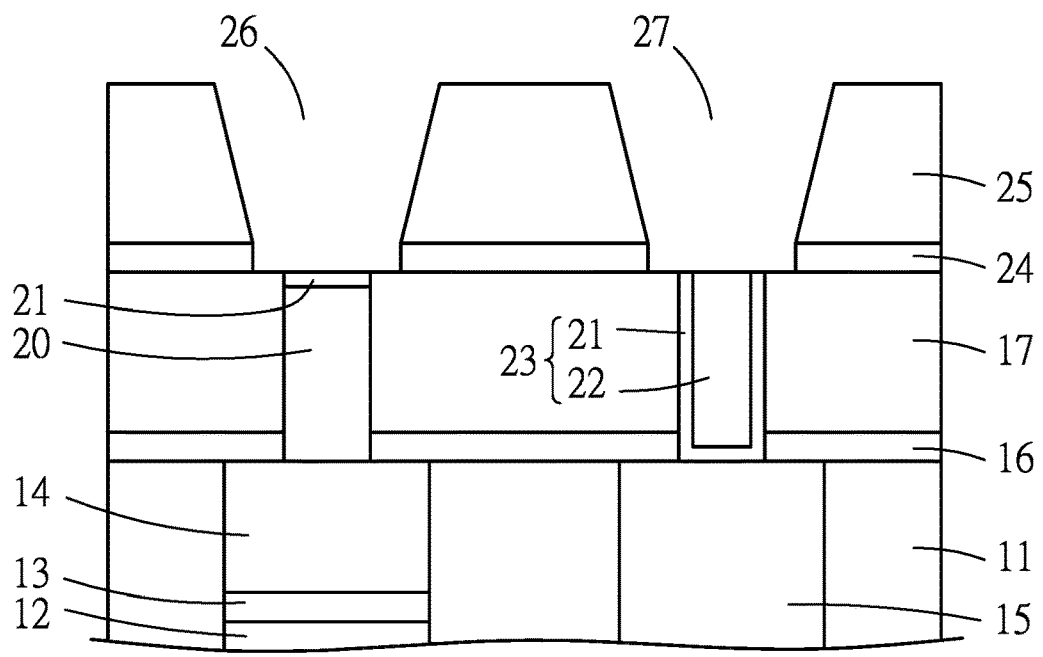

FIG. 9 illustrates that, after the formation of the third dielectric layer 25, the third dielectric layer 25 and the second etch stop layer 24 are etched to form a first through hole 26 and a second through hole 27. In this step, the titanium barrier layer 21 in the first opening 18 (see FIG. 3) is exposed from the first through hole 26, and the second tungsten contact feature 23 is exposed from the second through hole 27.

Figure 10:
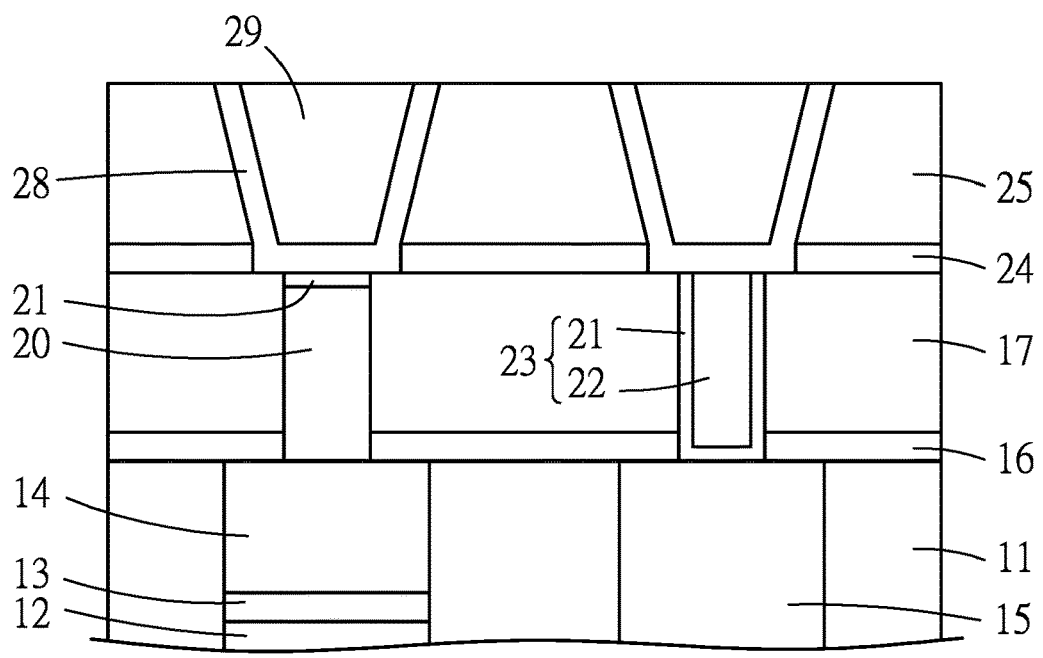

FIG. 10 illustrates that, after the formation of the first through hole 26 and the second through hole 27 (see FIG. 9), the first through hole 26 and the second through hole 27 are filled with a copper material to form a copper interconnect feature 29 in the third dielectric layer 25. The copper interconnect feature 29 is electrically connected to the first tungsten contact feature 20 and the second tungsten contact feature 23. In some embodiments, before the formation of the copper interconnect feature 29, a barrier/liner layer 28 may be formed in the first through hole 26 and the second through hole 27.

With the continuous shrinking of IC device dimensions, various structures of the contact feature are proposed in an attempt to further improve device performance, including lowering the contact resistance.

Figure 11:
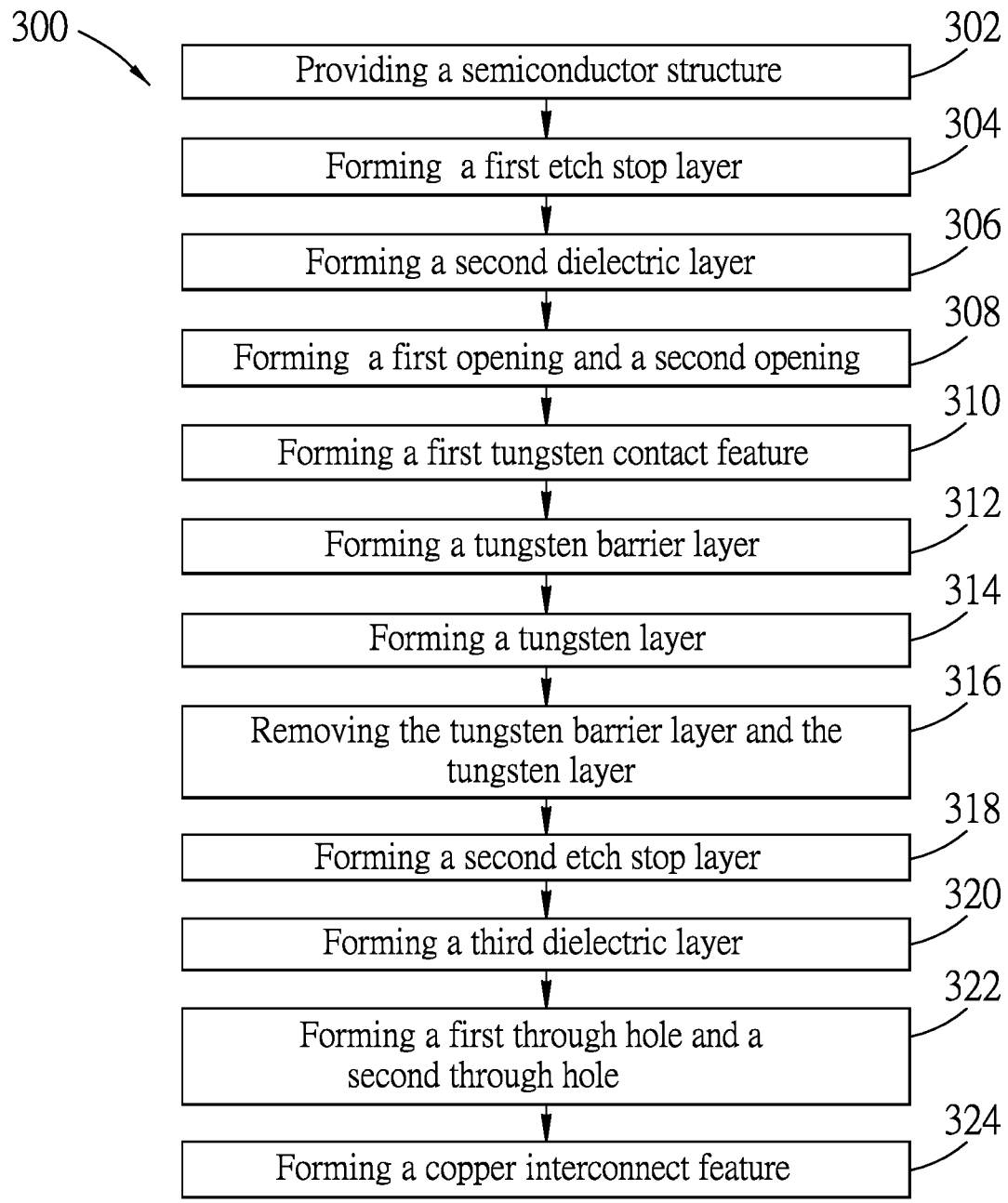
FIG. 11 illustrates a process flow for making a semiconductor device in accordance with some embodiments.

FIGS. 12 to 22 illustrate schematic views of intermediate steps in the formation of a semiconductor device in accordance with some embodiments. The corresponding processes are reflected in the flow chart 300 as shown in FIG. 11.

Figure 12:
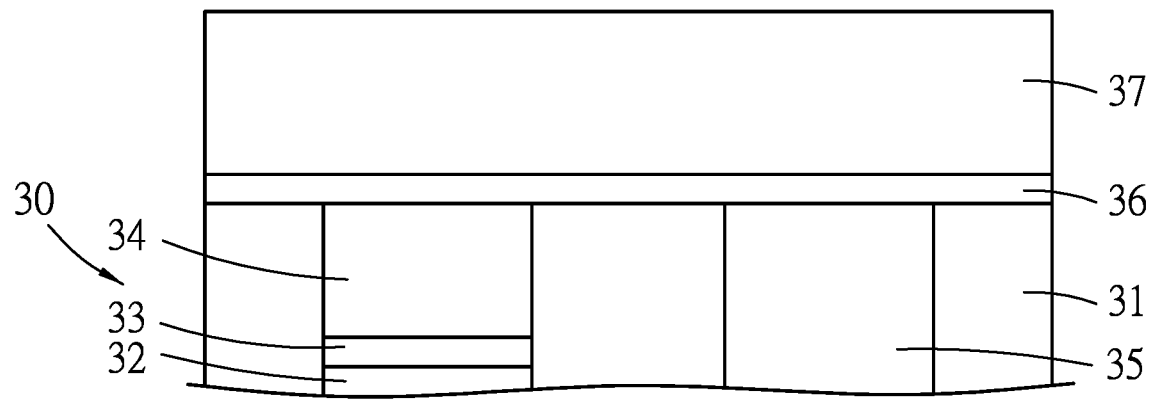
FIGS. 12 to 22 illustrate schematic views of steps in the formation of a semiconductor device in accordance with some embodiments.

Referring to FIG. 12, a semiconductor structure 30 is provided. This process is illustrated as process 302 in the flow chart 300 shown in FIG. 11. In some embodiments, the semiconductor structure 30 includes a substrate (not shown) which may be a semiconductor substrate, e.g., an elemental semiconductor or a compound semiconductor. The elemental semiconductor may be composed of single species of atoms, such as silicon (Si) and germanium (Ge) in group 14 of the periodic table. The compound semiconductor may be composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP) or the like. The compound semiconductor may have a gradient feature in which the elements thereof changes from one ratio at one location to another ratio at another location in the compound semiconductor. The compound semiconductor may be formed over a silicon substrate, and may be strained. In some embodiments, the substrate may include a multi-layer compound semiconductor structure. Alternatively, the substrate may include a non-semiconductor material, such as a glass, fused quartz, or calcium fluoride. Furthermore, in some embodiments, the substrate may be a semiconductor on insulator (SOI) (e.g., silicon germanium on insulator (SGOI)). Generally, an SOI substrate includes a layer of a semiconductor material such as epitaxial Si, Ge, SiGe, combinations thereof or the like. The substrate may be doped with a p-type dopant, such as boron (B), aluminum (Al), gallium (Ga), or the like, or may alternatively be doped with an n-type dopant, as is known in the art.

In some embodiments, the semiconductor structure 30 further includes a first dielectric layer 31 formed over the substrate by a suitable deposition technique, such as CVD or the like. In some embodiments, the first dielectric layer 31 includes undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), or other suitable materials. The first dielectric layer 31 may be formed using a suitable deposition technique, such as spin-on coating, flowable chemical vapor deposition (FCVD), plasma-enhanced chemical vapor deposition (PECVD), low pressure chemical vapor deposition (LPCVD), ALD or the like.

In some embodiments, the semiconductor structure 30 further includes a source/drain 32 formed on the substrate, a silicide 33 connected to the source/drain 32, a cobalt-containing conductive feature 34 connected to the silicide 33, and a non-cobalt conductive feature 35 spaced apart from the cobalt-containing conductive feature 34. In some embodiments, the source/drain 32 may be a source or drain region of a transistor, and may be formed in the substrate or over the substrate in the first dielectric layer 31. The source/drain 32 may be a polycrystalline silicon in-situ doped with an n-type impurity. In some embodiments, the n-type impurity may be phosphorus (P), nitrogen (N), arsenic (As), antimony (Sb), or the like. Alternatively, the source/drain 32 may be a polycrystalline silicon in-situ doped with a p-type impurity. In some embodiments, the p-type impurity may be Ge, B, Al, Ga, In, $BF_2$ or the like. The cobalt-containing conductive feature 34 is disposed on and electrically connected to the source/drain 32 via the silicide 33. In some embodiments, the cobalt-containing conductive feature 34 may be formed by a suitable deposition technique, such as PVD, CVD, ALD or the like. In some embodiments, the cobalt-containing conductive feature 34 may be a metal on OD (oxide-defining region), which may be abbreviated as MD. In other embodiments, the cobalt-containing conductive feature 34 may be connected to a gate structure (e.g., a metal gate (MG)) of the transistor instead of the source/drain 32, and the cobalt-containing conductive feature 34 connected to MG may be a metal on poly, which may be abbreviated as MP. The non-cobalt conductive feature 35 is formed in the first dielectric layer 31, and is spaced apart from the cobalt-containing conductive feature 34. In some embodiments, the non-cobalt conductive feature 35 may be an electrical connection structure of a high-resistance device (not shown), and may include a material other than cobalt. In some embodiments, the non-cobalt conductive feature 35 may include titanium/titanium nitride or the like.

After the provision of the semiconductor structure 30, a first etch stop layer 36 is formed on the first dielectric layer 31. This process is illustrated as process 304 in the flow chart 300 shown in FIG. 11. In some embodiments, the first etch stop layer 36 may be made of a suitable material, such as metal nitride, metal oxide, metal carbide, silicon nitride, silicon oxide, silicon carbide, combinations thereof or the like. In some embodiments, the metal may be Al, zirconium (Zr), yttrium (Y), hafnium (Hf), zinc (Zn), combinations thereof or the like. The first etch stop layer 36 may be formed by a suitable deposition technique, such as CVD, PECVD, ALD, spin-on coating, electroless plating or the like.

After the formation of the first etch stop layer 36, a second dielectric layer 37 is formed on the first etch stop layer 36. This process is illustrated as process 306 in the flow chart 300 shown in FIG. 11. In some embodiments, the second dielectric layer 37 includes a suitable material, such as USG, PSG, BSG, BPSG, FSG, $SiO_2$, SiOC-based materials (e.g., SiOCH) or the like. The second dielectric layer 37 may be formed using a suitable deposition technique, such as spin-on coating, FCVD, PECVD, LPCVD, ALD or the like.

Figure 13:
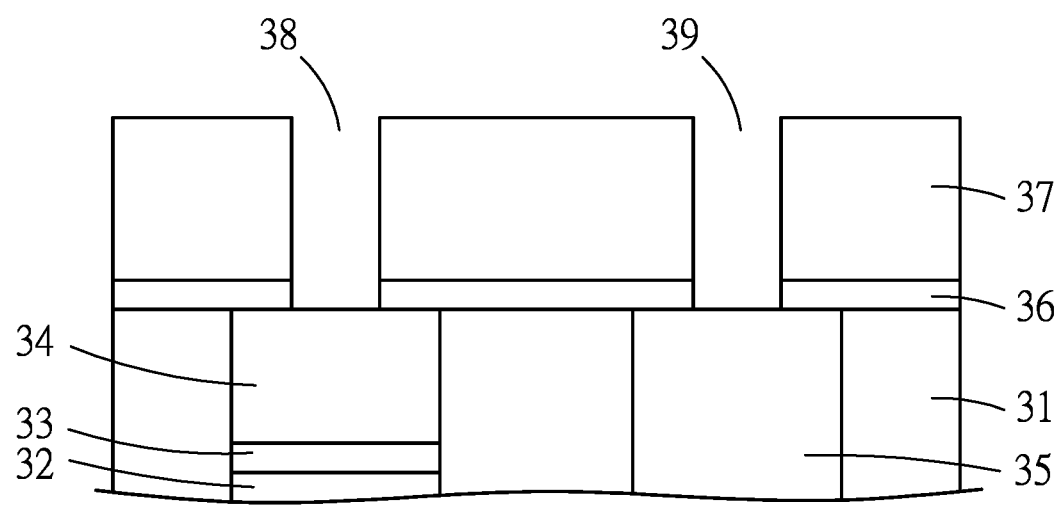

FIG. 13 illustrates that, after the formation of the second dielectric layer 37, the second dielectric layer 37 and the first etch stop layer 36 are etched to form a first opening 38 and a second opening 39. This process is illustrated as process 308 in the flow chart 300 shown in FIG. 11. In some embodiments, the second dielectric layer 37 and the first etch stop layer 36 may be etched by a suitable etching technique, such as plasma dry etching (e.g., plasma containing $H_2$, $N_2$, $NH_3$, $O_2$, CxFx or the like), so as to form the first opening 38 and the second opening 39. In this step, the cobalt-containing conductive feature 34 is exposed from the first opening 38, and the non-cobalt conductive feature 35 is exposed from the second opening 39.

Figure 14:
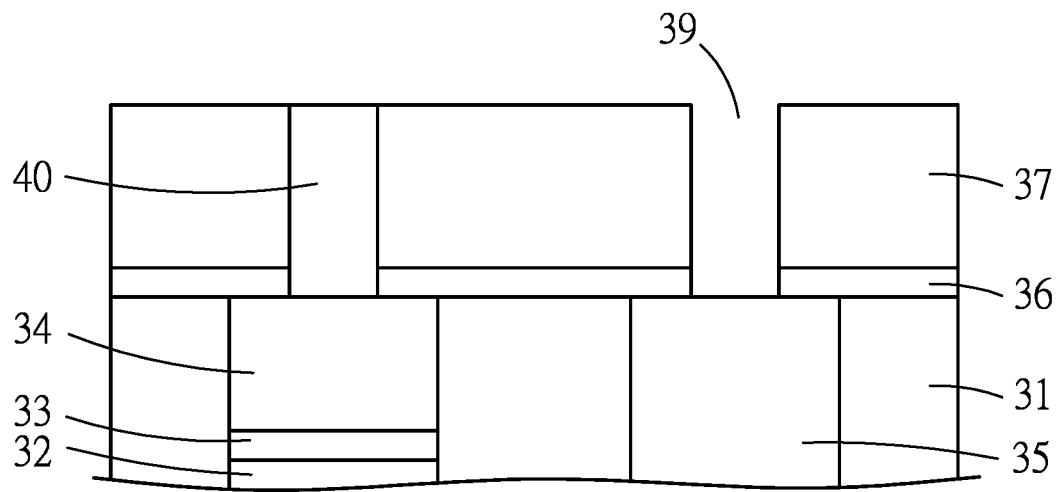

FIG. 14 illustrates that, after the formation of the first opening 38 (see FIG. 13) and the second opening 39, a first tungsten contact feature 40 is selectively formed in the first opening 38. This process is illustrated as process 310 in the flow chart 300 shown in FIG. 11. The first tungsten contact feature 40 is selectively formed over the cobalt-containing conductive feature 34, fills the first opening 38, and is electrically connected to the cobalt-containing conductive feature 34. In some embodiments, the first tungsten contact feature 40 is formed from tungsten hexafluoride ($WF_6$) by a suitable deposition technique, such as CVD, ALD or the like. In some embodiments, the first opening 38 may be completely filled with the first tungsten contact feature 40. In some embodiments, the first tungsten contact feature 40 may be a tungsten via contact.

Figure 15:
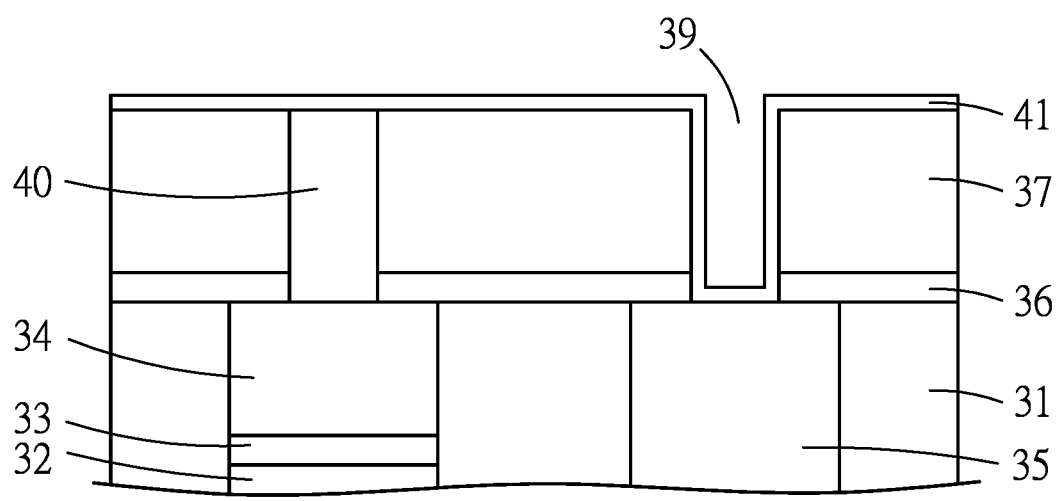

FIG. 15 illustrates that, after the formation of the first tungsten contact feature 40, a tungsten barrier layer 41 is conformally formed on a top surface of the second dielectric layer 37, a top surface of the first tungsten contact feature 40, a hole-defining wall that defines the second opening 39, and a top surface of the non-cobalt conductive feature 35 that is exposed from the second opening 39. This process is illustrated as process 312 in the flow chart 300 shown in FIG. 11. The tungsten barrier layer 41 may be formed from a suitable metal organic tungsten precursor, such as tungsten hexacarbonyl ($WCO_6$), by a suitable deposition technique, such as CVD, ALD or the like.

Figure 16:
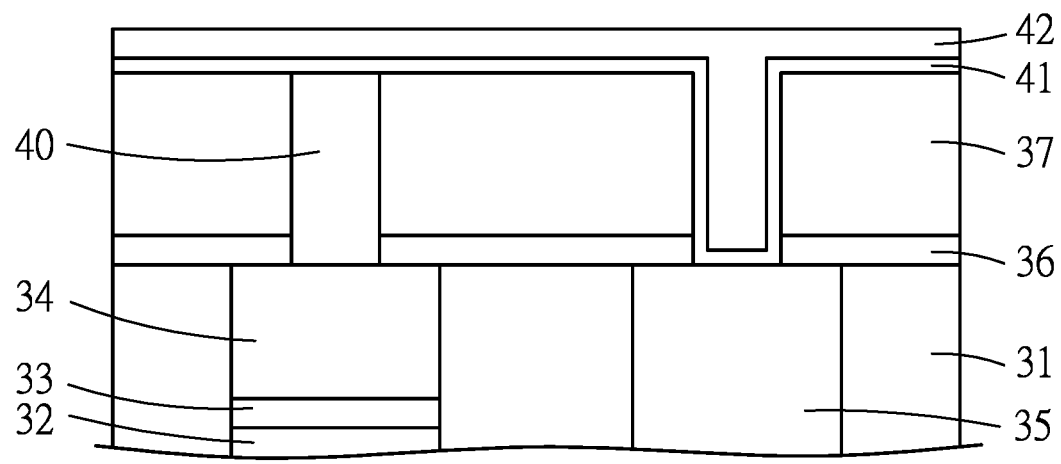

FIG. 16 illustrates that, after the formation of the tungsten barrier layer 41, a tungsten layer 42 is formed on the tungsten barrier layer 41 and fills the second opening 39 (see FIG. 15). This process is illustrated as process 314 in the flow chart 300 shown in FIG. 11. In some embodiments, the tungsten layer 42 may be formed by a suitable deposition technique, such as CVD or the like, and the tungsten barrier layer 41 may serve as a barrier/seed layer for the formation of the tungsten layer 42.

Figure 17:
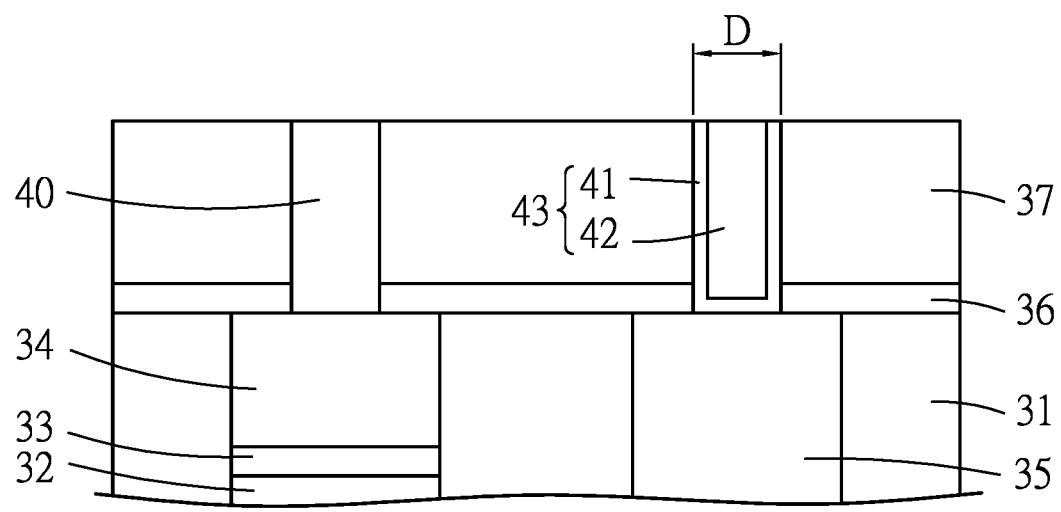

FIG. 17 illustrates that, after the formation of the tungsten layer 42, the tungsten barrier layer 41 and the tungsten layer 42 on the top surface of the second dielectric layer 37 are removed to form a second tungsten contact feature 43, which is composed of the tungsten barrier layer 41 and the tungsten layer 42, in the second opening 39 (see FIG. 15). This process is illustrated as process 316 in the flow chart 300 shown in FIG. 11. The tungsten barrier layer 41 and the tungsten layer 42 on the top surface of the second dielectric layer 37 may be removed by a suitable technique, such as CMP or the like. In the second opening 39, the tungsten barrier layer 41 surrounds the tungsten layer 42, and is connected to the tungsten layer 42, the non-cobalt conductive feature 35 and the second dielectric layer 37. The second tungsten contact feature 43 is electrically connected to the non-cobalt conductive feature 35. In some embodiments, a critical dimension (D) of the second tungsten contact feature 43 may range from about 16 nm to about 28 nm, such as about 16 nm, about 20 nm, about 28 nm, and other range values are also within the scope of the disclosure. In some embodiments, an aspect ratio of the second tungsten contact feature 43 may range from about 0.4 to about 2.5, and other range values are also within the scope of the disclosure. In some embodiments, the second tungsten contact feature 43 may be a tungsten via contact. In some embodiments, a top view of each of the first tungsten contact feature 40 and the second tungsten contact feature 43 in FIG. 17 may have a substantially circular shape. In other embodiments, the top view of each of the first tungsten contact feature 40 and the second tungsten contact feature 43 may have an elongated shape (e.g., when used as a butted contact), and other geometries are also within the scope of the disclosure. When each of the first tungsten contact feature 40 and the second tungsten contact feature 43 is used as a butted contact, it may have a critical dimension ranging from about 20 nm to about 74 nm, such as about 20 nm, about 40 nm, about 54 nm, about 74 nm, and other range values are also within the scope of the disclosure.

Figure 18:
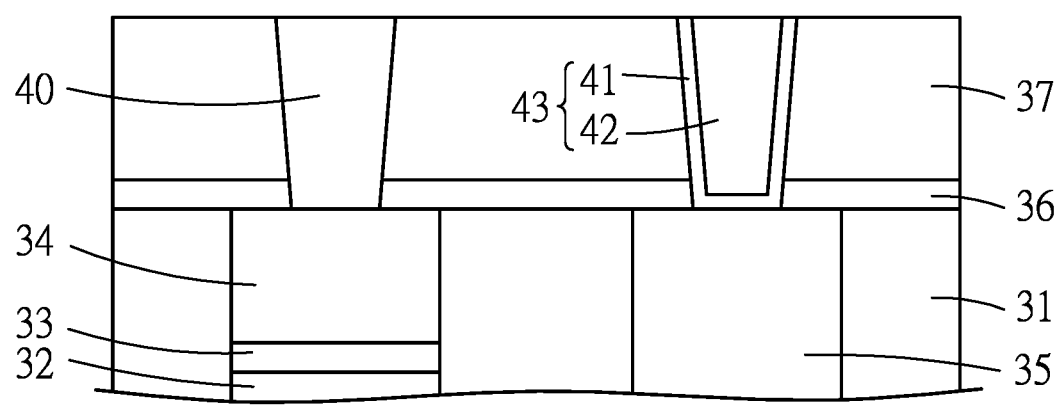

In some embodiments, in process 308 of FIG. 13, cross-sections of the first opening 38 and the second opening 39 (see FIG. 13) may each be in an inverted trapezoid shape after the second dielectric layer 37 and the first etch stop layer 36 are etched. Therefore, the subsequently formed first tungsten contact feature 40 and second tungsten contact feature 43 also exhibit inverted trapezoid cross-sections, as shown in FIG. 18.

Figure 19:
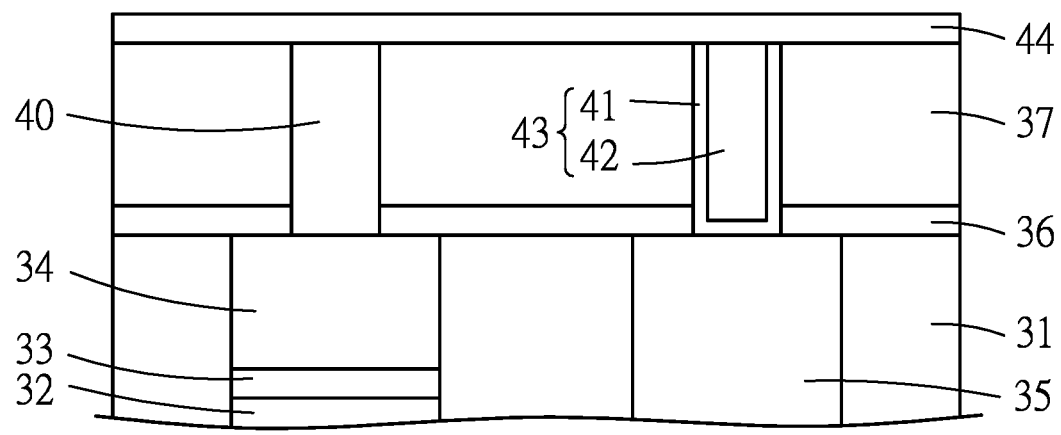

FIG. 19 illustrates that, after removal of the tungsten barrier layer 41 and the tungsten layer 42, a second etch stop layer 44 is formed on the second dielectric layer 37 by a suitable deposition technique, such as CVD, ALD, spin-on coating or the like. This process is illustrated as process 318 in the flow chart 300 shown in FIG. 11. In some embodiments, the second etch stop layer 44 may be made of a suitable material, such as metal nitride, metal oxide, metal carbide, silicon nitride, silicon oxide, silicon carbide, combinations thereof or the like. In some embodiments, the metal may be Al, Zr, Y, Hf, Zn, combinations thereof or the like.

Figure 20:
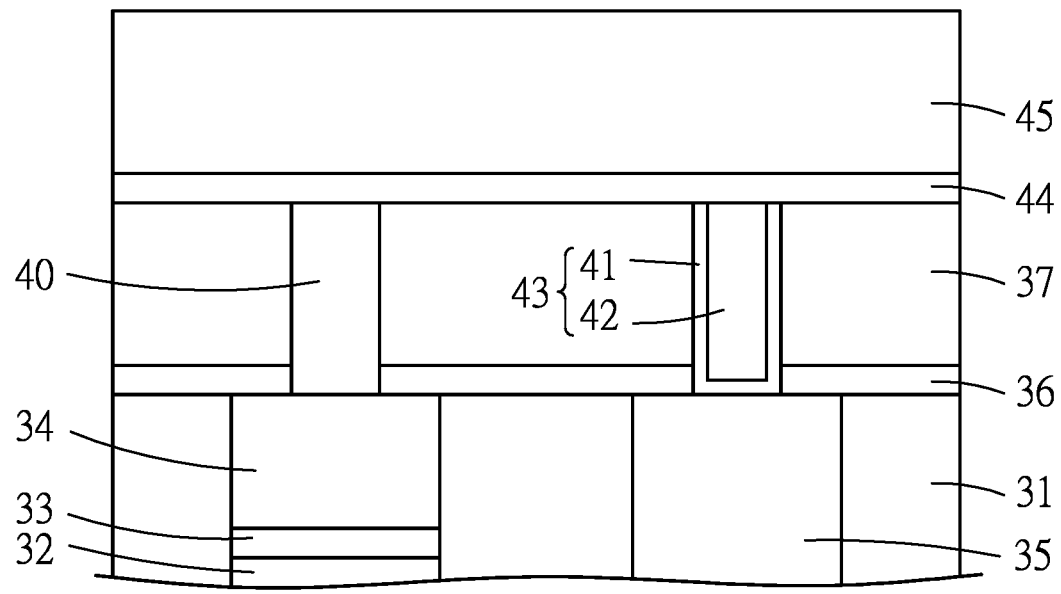

FIG. 20 illustrates that, after the formation of the second etch stop layer 44, a third dielectric layer 45 is formed on the second etch stop layer 44 by a suitable deposition technique, such as CVD or the like. This process is illustrated as process 320 in the flow chart 300 shown in FIG. 11. In some embodiments, the third dielectric layer 45 includes a suitable material, such as USG, PSG, BSG, BPSG, FSG, $SiO_2$, SiOC-based materials (e.g., SiOCH) or the like.

Figure 21:
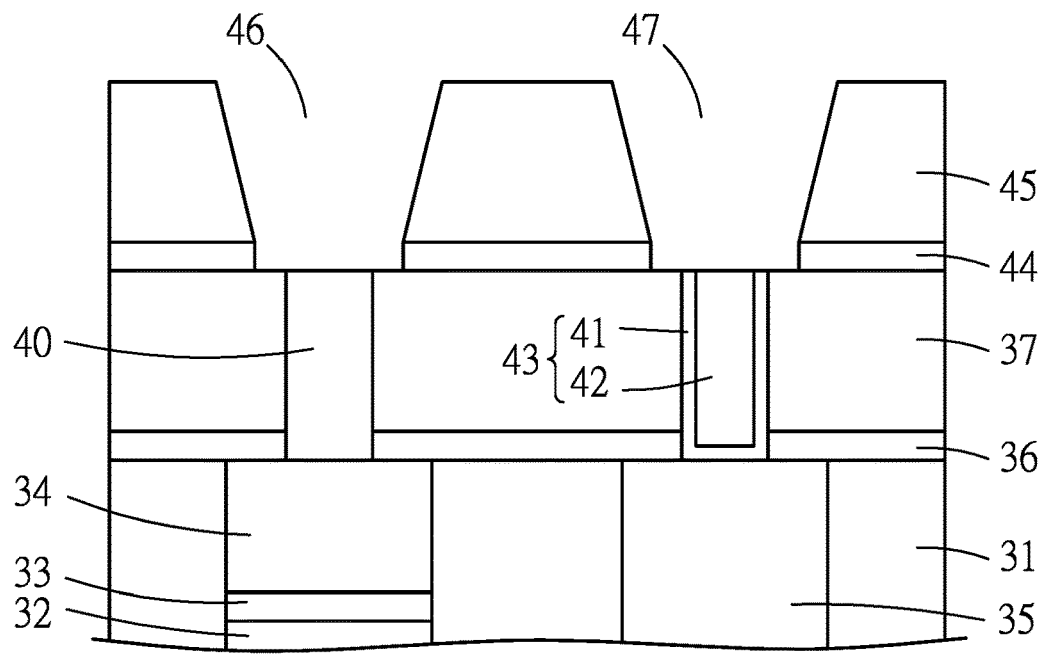

FIG. 21 illustrates that, after the formation of the third dielectric layer 45, the third dielectric layer 45 and the second etch stop layer 44 are etched to form a first through hole 46 and a second through hole 47. This process is illustrated as process 322 in the flow chart 300 shown in FIG. 11. In some embodiments, the third dielectric layer 45 and the second etch stop layer 44 may be etched by a suitable etching technique, such as plasma dry etching (e.g., plasma containing $H_2$, $N_2$, $NH_3$, $O_2$, CxFx or the like), so as to form the first through hole 46 and the second through hole 47. In this step, the first tungsten contact feature 40 is exposed from the first through hole 46, and the second tungsten contact feature 43 is exposed from the second through hole 47.

Figure 22:
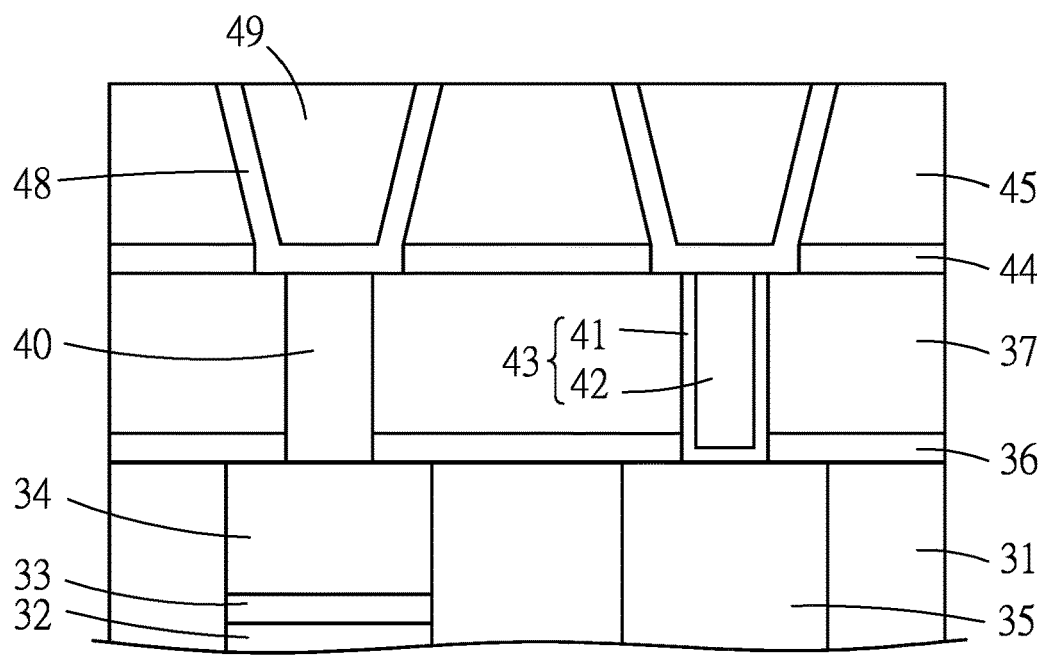

Referring again to FIG. 21, in combination with FIG. 22, after the formation of the first through hole 46 and the second through hole 47, the first through hole 46 and the second through hole 47 are filled with a copper material to form a copper interconnect feature 49 in the third dielectric layer 45. This process is illustrated as process 324 in the flow chart 300 shown in FIG. 11. The copper interconnect feature 49 is electrically connected to the first tungsten contact feature 40 (or a first tungsten via contact) and the second tungsten contact feature 43 (or a second tungsten via contact). In some embodiments, the first tungsten contact feature 40 (or the first tungsten via contact) and the second tungsten contact feature 43 (or the second tungsten via contact) may include copper diffused from the copper interconnect feature 49. In some embodiments, the copper interconnect feature 49 may be formed by a suitable deposition technique, such as PVD, CVD, ELD or the like. In some embodiments, before the formation of the copper interconnect feature 49, a barrier/liner layer 48 may be formed. In some embodiments, the barrier/liner layer 48 includes a barrier, a liner, or a combination thereof. In some embodiments, the barrier/liner layer 48 may include a suitable material, such as TaN, TiN, Ru, MnN, ZnO, MoN, Ta, Ti, Co, Ru, combinations thereof or the like.

Figure 23:
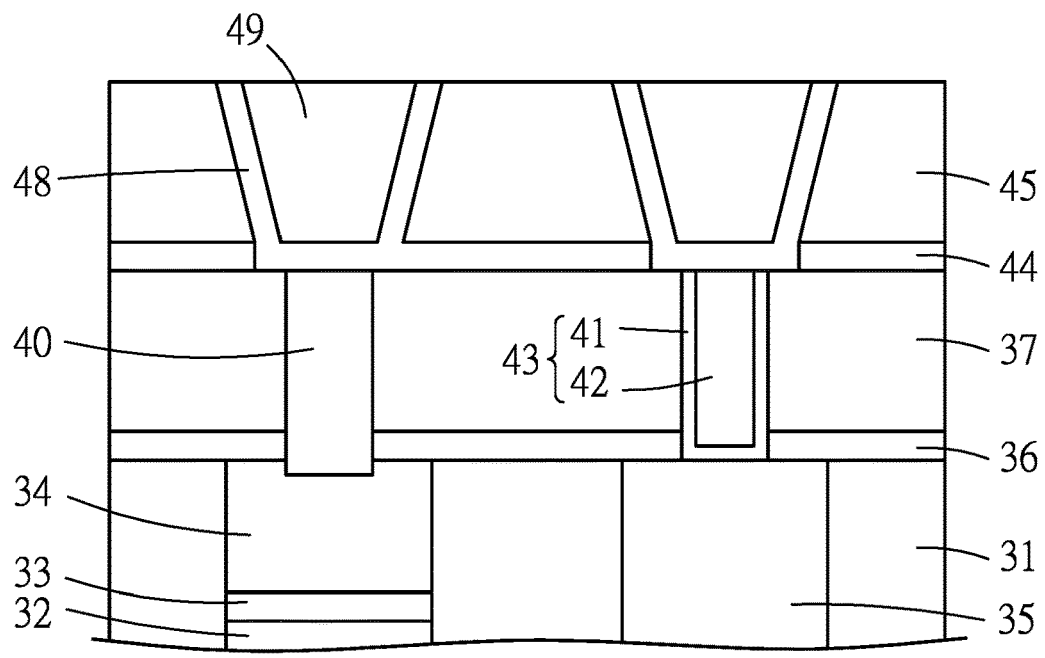
FIGS. 23 to 25 illustrate various examples of a first tungsten contact feature of a semiconductor device in accordance with some embodiments.

FIG. 23 illustrates that, in some embodiments, in the formation of the first opening 38 (see FIG. 13), a portion of the cobalt-containing conductive feature 34 may be etched away such that the cobalt-containing conductive feature 34 is formed with a recess, and in the selective formation of the first tungsten contact feature 40, the recess is filled with the first tungsten contact feature 40. In other words, in such embodiments, the first tungsten contact feature 40 extends into the cobalt-containing conductive feature 34.

Figure 24:
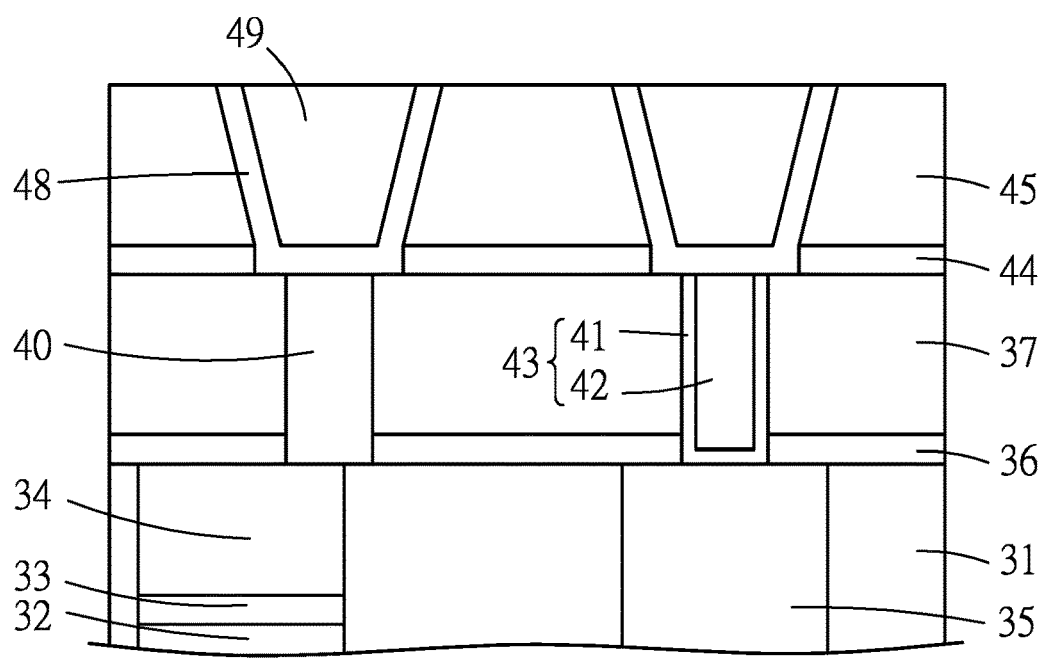

FIG. 24 illustrates that, in some embodiments, in the formation of the first opening 38 (see FIG. 13), a portion of the first dielectric layer 31 and a portion of the cobalt-containing conductive feature 34 are exposed from the first opening 38, and in the selective formation of the first tungsten contact feature 40, a bottom surface of the first tungsten contact feature 40 is in contact with the cobalt-containing conductive feature 34 and the first dielectric layer 31.

Figure 25:
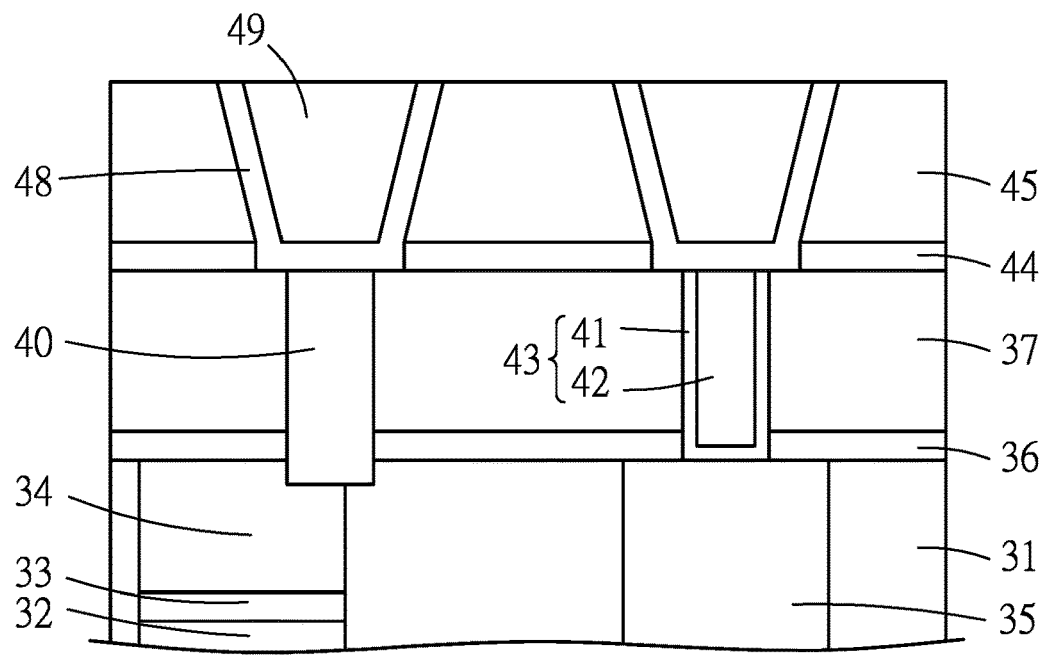

FIG. 25 illustrates that, in some embodiments, in the formation of the first opening 38 (see FIG. 13), a portion of the cobalt-containing conductive feature 34 and a portion of the first dielectric layer 31 are etched away such that the cobalt-containing conductive feature 34 and the first dielectric layer 31 are cooperatively formed with a recess, and in the selective formation of the first tungsten contact feature 40, the recess is filled with the first tungsten contact feature 40. In other words, in such embodiments, the first tungsten contact feature 40 extends into the cobalt-containing conductive feature 34 and the first dielectric layer 31.

Figure 26:
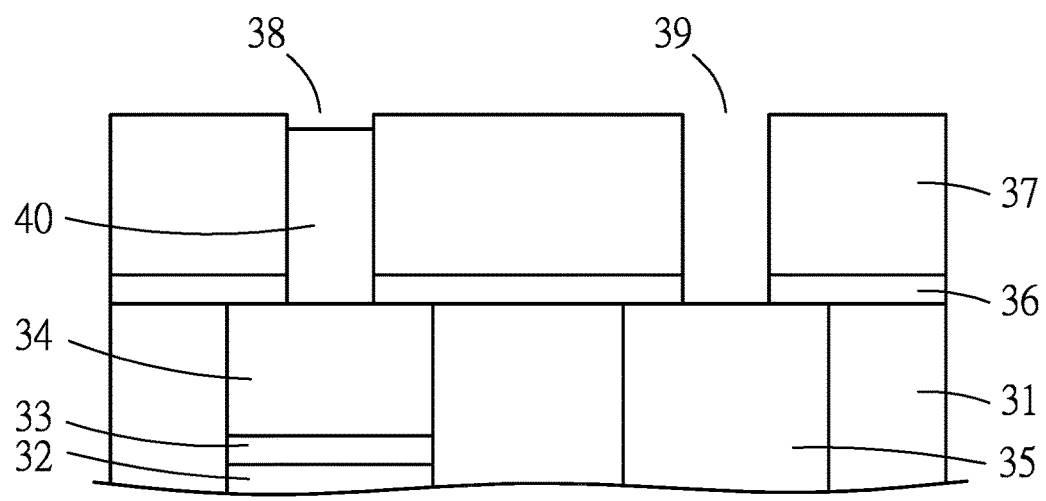
FIGS. 26 to 29 illustrate schematic views of steps in the formation of a semiconductor device in accordance with some embodiments.

Referring to FIG. 26, in accordance with some embodiments, the process of forming the first tungsten contact feature 40 (i.e., process 310 in the flow chart 300 as shown in FIG. 11) involves forming the first tungsten contact feature 40 which only partially fills the first opening 38.

Figure 27:
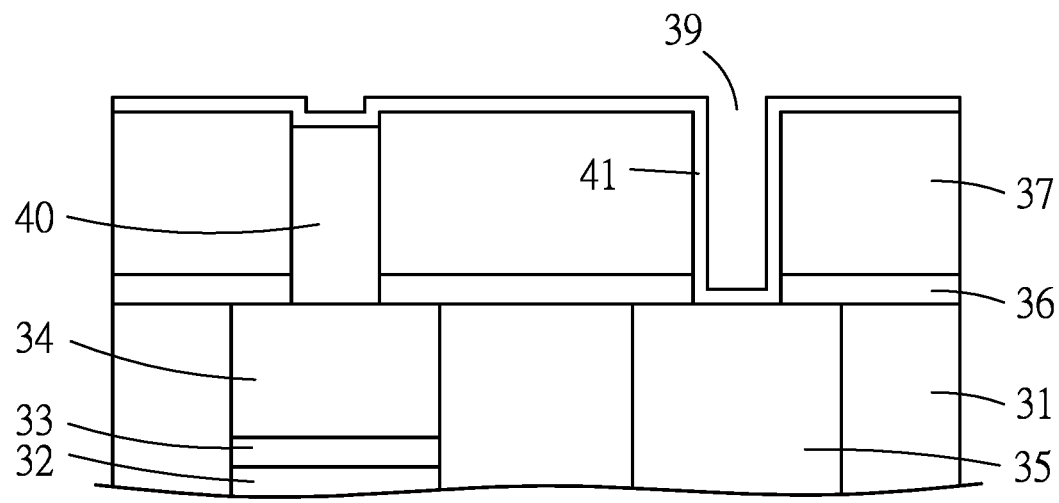

Referring to FIG. 27, in accordance with some embodiments, the process of forming the tungsten barrier layer 41 (i.e., process 312 in the flow chart 300 as shown in FIG. 11) involves forming the tungsten barrier layer 41 on the top surface of the second dielectric layer 37, the hole-defining wall that defines the second opening 39 and the top surface of the non-cobalt conductive feature 35. In this embodiment, the tungsten barrier layer 41 also fills the first opening 38 (see FIG. 26).

Figure 28:
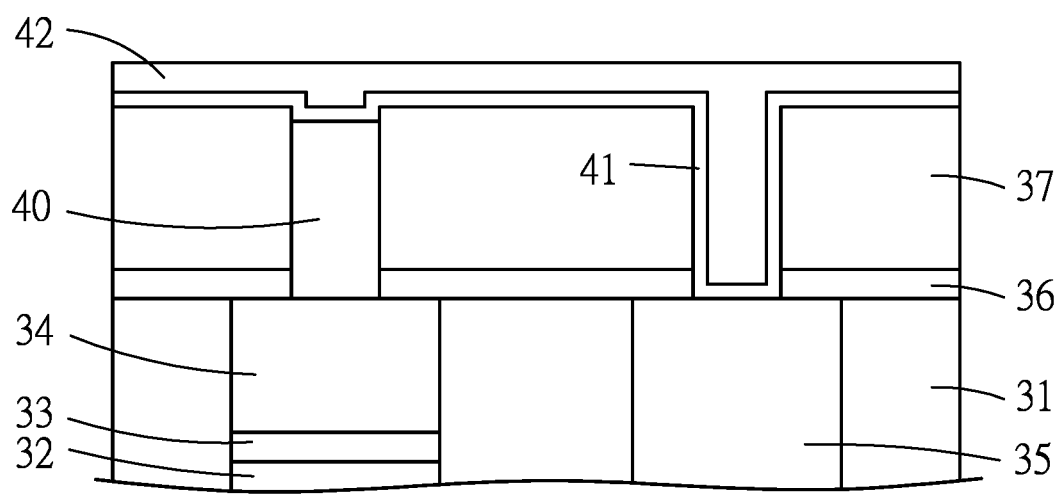

FIG. 28 illustrates that, after the formation of the tungsten barrier layer 41, the tungsten layer 42 is formed on the tungsten barrier layer 41 to fill the second opening 39 (see FIG. 27). That is, process 314 in the flow chart 300 as shown in FIG. 11 is performed.

Figure 29:
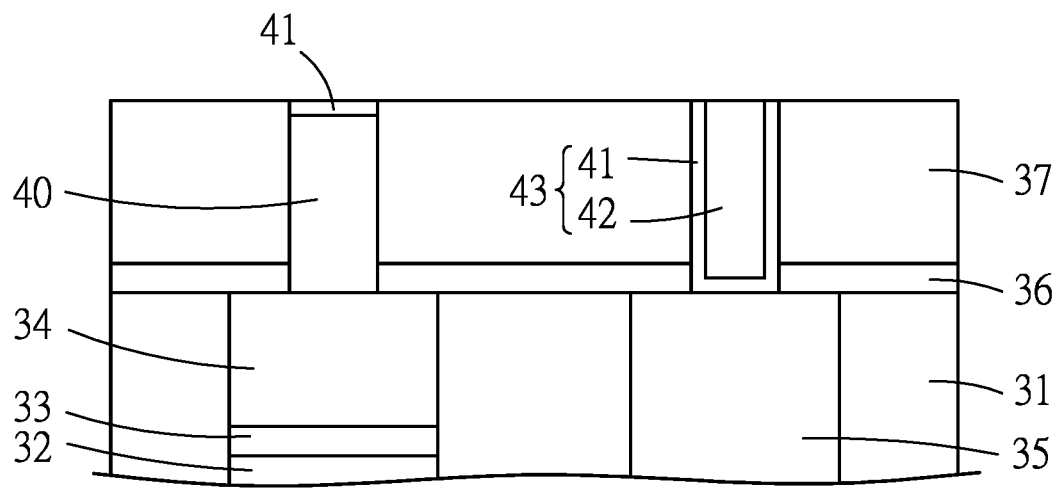

FIG. 29 illustrates that, after the formation of the tungsten layer 42, the tungsten barrier layer 41 and the tungsten layer 42 on the top surface of the second dielectric layer 37 are removed to form the second tungsten contact feature 43 in the second opening 39 (see FIG. 27) (i.e., process 316 in the flow chart 300 as shown in FIG. 11 is performed). In this embodiment, the first opening 38 is completely filled with the tungsten barrier layer 41 and the first tungsten contact feature 40. Afterwards, processes 318 to 324 as shown in FIG. 11 can be performed.

Figure 30:
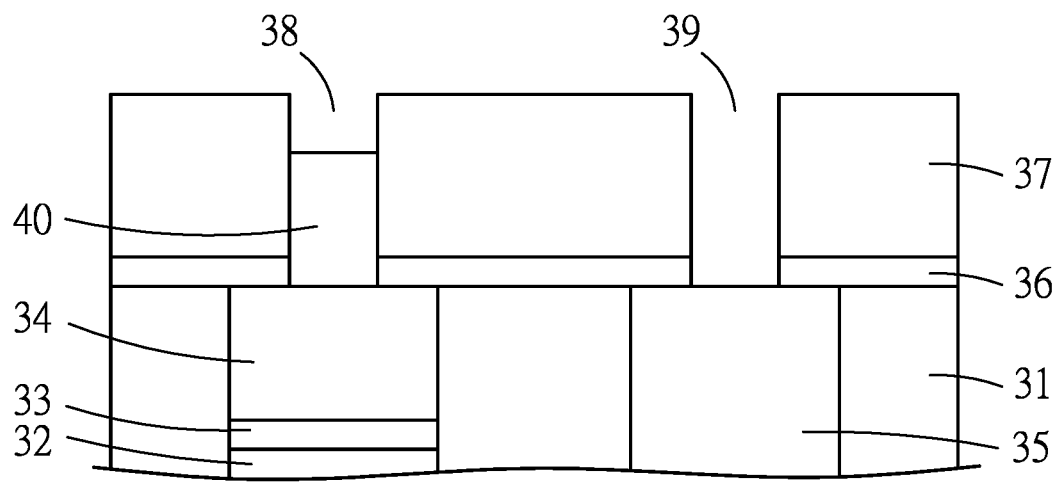
FIGS. 30 to 33 illustrate schematic views of steps in the formation of a semiconductor device in accordance with some embodiments.

Referring to FIG. 30, in accordance with some embodiments, the process of forming the first tungsten contact feature 40 (i.e., process 310 in the flow chart 300 as shown in FIG. 11) involves forming the first tungsten contact feature 40 which only partially fills the first opening 38.

Figure 31:
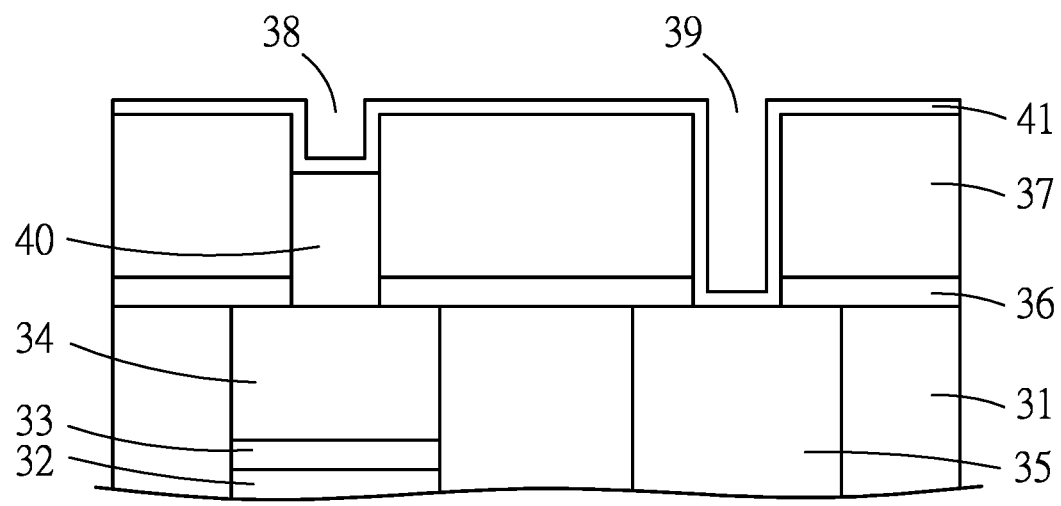

Referring to FIG. 31, in accordance with some embodiments, the process of forming the tungsten barrier layer 41 (i.e., process 312 in the flow chart 300 as shown in FIG. 11) involves forming the tungsten barrier layer 41 on the top surface of the second dielectric layer 37, the hole-defining wall that defines the second opening 39, and the top surface of the non-cobalt conductive feature 35. In this embodiment, the tungsten barrier layer 41 also fills the first opening 38.

Figure 32:
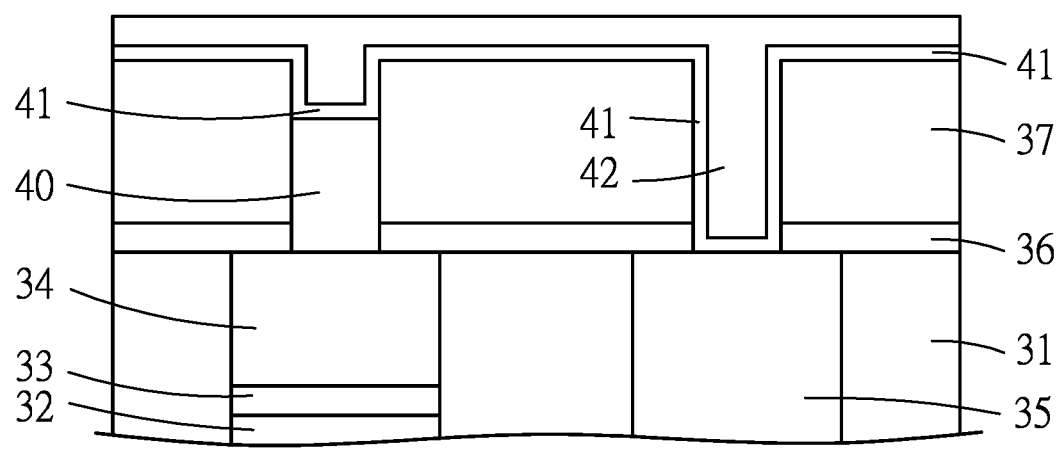

FIG. 32 illustrates that, after the formation of the tungsten barrier layer 41, the tungsten layer 42 is formed on the tungsten barrier layer 41 to fill the first opening 38 and the second opening 39 (see FIG. 31). That is, process 314 in the flow chart 300 as shown in FIG. 11 is performed.

Figure 33:
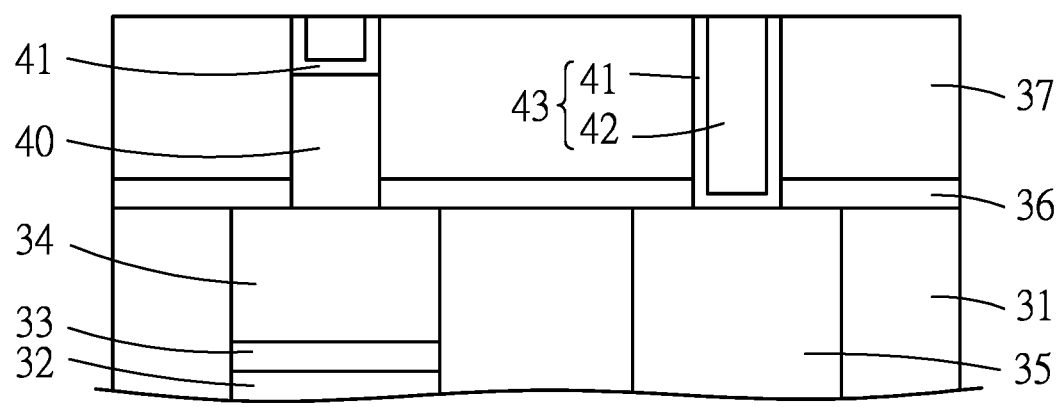

FIG. 33 illustrates that, after the formation of the tungsten layer 42, the tungsten barrier layer 41 and the tungsten layer 42 on the top surface of the second dielectric layer 37 are removed to form the second tungsten contact feature 43 in the second opening 39 (see FIG. 31) (i.e., process 316 in the flow chart 300 as shown in FIG. 11 is performed). In this embodiment, the first opening 38 (see FIG. 31) is completely filled with the first tungsten contact feature 40, the tungsten barrier layer 41 and the tungsten layer 42. Afterwards, processes 318 to 324 as shown in FIG. 11 can be performed.

The embodiments of the present disclosure have some advantageous features. In some embodiments of the present disclosure, the first tungsten contact feature is selectively formed on and covers the cobalt-containing conductive feature, followed by forming the tungsten barrier layer. By having the first tungsten contact feature covering the cobalt-containing conductive feature, possible contamination of the cobalt-containing conductive feature by the precursor (e.g., W(CO)$_6$) for forming the tungsten barrier layer may be avoided. In addition, the tungsten barrier layer may replace other barrier layers (e.g., Ti/TiN barrier layer) for the tungsten layer in the second opening. The tungsten barrier layer may have an electrical conductivity lower than that of the Ti/TiN barrier layer, and may have a thickness lower than that of the Ti/TiN barrier layer, allowing the bulk tungsten (i.e., the tungsten layer in the second opening) to have larger volume and allowing the second tungsten contact feature to have a lower electrical conductivity, as compared with a tungsten contact with the Ti/TiN barrier layer. In embodiments where the first opening is not completely filled with the first tungsten contact feature, by using the tungsten barrier layer to replace the Ti/TiN barrier layer, a Ti/TiN layer insertion into the first opening can be avoided. In some embodiments, the uniformity of the contact resistance (RC) or the sheet resistance (RS) of the second tungsten contact feature may be improved up to more than 50% as compared with a tungsten contact with the Ti/TiN barrier layer.

In accordance with some embodiments, a semiconductor device includes a first dielectric layer, a cobalt-containing conductive feature, a non-cobalt conductive feature, a second dielectric layer, a first tungsten contact feature, a second tungsten contact feature, and a tungsten barrier layer. The cobalt-containing conductive feature is disposed in the first dielectric layer. The non-cobalt conductive feature is disposed in the first dielectric layer and is spaced apart from the cobalt-containing conductive feature. The second dielectric layer is disposed over the first dielectric layer. The first tungsten contact feature is disposed in the second dielectric layer, and is electrically connected to the cobalt-containing conductive feature. The second tungsten contact feature is disposed in the second dielectric layer, and is electrically connected to the non-cobalt conductive feature. The tungsten barrier layer surrounds the second tungsten contact feature, and is connected to the second tungsten contact feature, the non-cobalt conductive feature and the second dielectric layer.

In accordance with some embodiments, a semiconductor device includes a dielectric layer, a cobalt-containing device-level contact feature, a non-cobalt device-level contact feature, a first tungsten via contact, and a second tungsten via contact. The cobalt-containing device-level contact feature is disposed in the dielectric layer. The non-cobalt device-level contact feature is disposed in the dielectric layer and is spaced apart from the cobalt-containing device-level contact feature. The first tungsten via contact is disposed in the dielectric layer, and is disposed over and electrically connected to the cobalt-containing device-level contact feature. The second tungsten via contact is disposed in and directly connected to the dielectric layer, and is disposed over and electrically connected to the non-cobalt device-level contact feature.

In accordance with some embodiments, a method for making a semiconductor device includes: forming a non-cobalt conductive feature and a cobalt-containing conductive feature in a first dielectric layer; forming a second dielectric layer on the first dielectric layer; forming a first opening and a second opening in the second dielectric layer, the cobalt-containing conductive feature being exposed from the first opening, the non-cobalt conductive feature being exposed from the second opening; selectively forming a first tungsten contact feature in the first opening, the first tungsten contact feature being electrically connected to the cobalt-containing conductive feature; forming a barrier layer on a hole-defining wall that defines the second opening and a top surface of the non-cobalt conductive feature that is exposed from the second opening, the barrier layer being formed from a metal organic tungsten precursor; and forming a tungsten layer on the barrier layer so as to form a second tungsten contact feature in the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
    forming a non-cobalt conductive feature and a cobalt-containing conductive feature in a first dielectric layer;
    forming a second dielectric layer on the first dielectric layer;
    forming a first opening and a second opening in the second dielectric layer, the cobalt-containing conductive feature being exposed from the first opening, the non-cobalt conductive feature being exposed from the second opening;
    selectively forming a first tungsten contact feature in the first opening, the first tungsten contact feature being electrically connected to the cobalt-containing conductive feature;
    forming a barrier layer on a hole-defining wall that defines the second opening and a top surface of the non-cobalt conductive feature that is exposed from the second opening, the barrier layer being formed from a metal organic tungsten precursor; and
    forming a tungsten layer on the barrier layer so as to form a second tungsten contact feature in the second opening.

2. The method as claimed in claim 1, wherein, in the selective formation of the first tungsten contact feature, the first tungsten contact feature is formed from tungsten hexafluoride.

3. The method as claimed in claim 1, wherein, in the formation of the barrier layer, the metal organic tungsten precursor includes tungsten hexacarbonyl.

4. The method as claimed in claim 1, wherein:
    in the formation of the first opening and the second opening, a portion of the cobalt-containing conductive feature is etched away such that the cobalt-containing conductive feature is formed with a recess; and
    in the selective formation of the first tungsten contact feature, the recess is filled with the first tungsten contact feature.

5. The method as claimed in claim 1, wherein:
    in the selective formation of the first tungsten contact feature, the first opening is partially filled with the first tungsten contact feature; and
    in the formation of the barrier layer, a portion of the barrier layer is formed in the first opening and on the first tungsten contact feature.

6. The method as claimed in claim 5, wherein, in the formation of the tungsten layer, a portion of the tungsten layer is formed in the first opening, the first opening being completely filled with the first tungsten contact feature, the barrier layer and the tungsten layer.

7. The method as claimed in claim 1, wherein:
in the formation of the first opening and the second opening, a portion of the first dielectric layer is exposed from the first opening; and
in the selective formation of the first tungsten contact feature, a bottom surface of the first tungsten contact feature is in contact with the cobalt-containing conductive feature and the first dielectric layer.

8. The method as claimed in claim 1, further comprising:
forming a third dielectric layer on the second dielectric layer; and
forming a copper interconnect feature in the third dielectric layer, the copper interconnect feature being electrically connected to the first tungsten contact feature and the second tungsten contact feature, the first tungsten contact feature and the second tungsten contact feature further including copper diffused from the copper interconnect feature.

9. The method as claimed in claim 1, wherein:
in the formation of the barrier layer, the barrier layer is further formed on a top surface of the second dielectric layer; and
in the formation of the tungsten layer, the barrier layer and the tungsten layer on the top surface of the second dielectric layer are removed.

10. A method for making a semiconductor device, comprising:
forming a first conductive feature and a second conductive feature in a first dielectric layer;
forming a second dielectric layer on the first dielectric layer, the second dielectric layer having first opening and a second opening that respectively expose the first and second conductive features;
forming a first tungsten contact feature in the first opening to be connected to the first conductive feature, while leaving the second conductive feature exposed from the second opening;
conformally forming a tungsten-containing barrier layer on a hole-defining wall that defines the second opening and a top surface of the second conductive feature exposed from the second opening; and
forming a tungsten layer to fill the second opening.

11. The method as claimed in claim 10, wherein:
in the formation of the first tungsten contact feature, the first tungsten contact feature is formed from tungsten hexafluoride; and
in the conformal formation of the tungsten-containing barrier layer, the tungsten-containing barrier layer is formed from a metal organic tungsten precursor.

12. The method as claimed in claim 11, wherein, in the formation of the tungsten-containing barrier layer, the metal organic tungsten precursor includes tungsten hexacarbonyl.

13. The method as claimed in claim 10, wherein:
in the formation of the first tungsten contact feature, the first opening is partially filled with the first tungsten contact feature; and
in the formation of the tungsten-containing barrier layer, a portion of the tungsten-containing barrier layer is formed in the first opening and on the first tungsten contact feature.

14. The method as claimed in claim 13, wherein, in the formation of the tungsten layer, a portion of the tungsten layer is formed in the first opening, the first opening being completely filled with the first tungsten contact feature, the tungsten-containing barrier layer and the tungsten layer.

15. A method for making a semiconductor device, comprising:
forming a non-cobalt conductive feature and a cobalt-containing conductive feature in a first dielectric layer;
forming a second dielectric layer on the first dielectric layer;
forming a first opening and a second opening in the second dielectric layer, the cobalt-containing conductive feature being exposed from the first opening, the non-cobalt conductive feature being exposed from the second opening;
covering the cobalt-containing conductive feature exposed from the first opening with a first tungsten contact feature, while leaving the second conductive feature exposed from the second opening;
conformally forming a tungsten-containing barrier layer on a hole-defining wall that defines the second opening and a top surface of the second conductive feature exposed from the second opening; and
forming a tungsten layer to fill the second opening.

16. The method as claimed in claim 15, wherein:
in the covering of the cobalt-containing conductive feature, the first tungsten contact feature is selectively formed from tungsten hexafluoride; and
in the conformal formation of the tungsten-containing barrier layer, the tungsten-containing barrier layer is formed from a metal organic tungsten precursor.

17. The method as claimed in claim 16, wherein, in the formation of the tungsten-containing barrier layer, the metal organic tungsten precursor includes tungsten hexacarbonyl.

18. The method as claimed in claim 15, wherein:
in the covering of the cobalt-containing conductive feature, the first opening is partially filled with the first tungsten contact feature; and
in the conformal formation of the tungsten-containing barrier layer, a portion of the tungsten-containing barrier layer is formed in the first opening and on the first tungsten contact feature.

19. The method as claimed in claim 18, wherein, in the formation of the tungsten layer, a portion of the tungsten layer is formed in the first opening, the first opening being completely filled with the first tungsten contact feature, the tungsten-containing barrier layer and the tungsten layer.

20. The method as claimed in claim 19, wherein, in the formation of the tungsten layer, the portion of the tungsten layer formed in the first opening is surrounded by the tungsten-containing barrier layer.

* * * * *